(12) United States Patent
Chung et al.

(10) Patent No.: US 11,177,184 B2
(45) Date of Patent: Nov. 16, 2021

(54) METHOD OF MANUFACTURING A FLIP CHIP PACKAGE AND AN APPARATUS FOR TESTING FLIP CHIPS

(71) Applicant: SK hynix Inc., Icheon-si (KR)

(72) Inventors: Jee Won Chung, Seoul (KR); Dong Jin Kim, Icheon-si (KR); Byeung Ho Kim, Cheongju-si (KR); Chang Hyun Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 12 days.

(21) Appl. No.: 16/669,050

(22) Filed: Oct. 30, 2019

(65) Prior Publication Data

US 2020/0357705 A1    Nov. 12, 2020

(30) Foreign Application Priority Data

May 10, 2019  (KR) .......................... 10-2019-0054896

(51) Int. Cl.
| | |
|---|---|
| *H01L 21/66* | (2006.01) |
| *H01L 21/56* | (2006.01) |
| *H01L 21/78* | (2006.01) |
| *H01L 21/67* | (2006.01) |
| *H01L 23/00* | (2006.01) |

(52) U.S. Cl.
CPC ............ *H01L 22/14* (2013.01); *H01L 21/561* (2013.01); *H01L 21/563* (2013.01); *H01L 21/67242* (2013.01); *H01L 21/78* (2013.01); *H01L 24/81* (2013.01); *H01L 24/05* (2013.01); *H01L 24/16* (2013.01); *H01L 2224/0401* (2013.01); *H01L 2224/16227* (2013.01)

(58) Field of Classification Search
CPC ....................................................... H01L 22/14
USPC ............................................................ 438/15
See application file for complete search history.

(56) References Cited

U.S. PATENT DOCUMENTS

| | | | | |
|---|---|---|---|---|
| 5,668,305 A | * | 9/1997 | Chi ........................ | G01L 27/007 |
| | | | | 73/37 |
| 2003/0146519 A1 | * | 8/2003 | Huang ................ | H01L 23/3677 |
| | | | | 257/778 |
| 2013/0323864 A1 | * | 12/2013 | Mo ..................... | G01R 31/2891 |
| | | | | 438/17 |
| 2020/0271715 A1 | * | 8/2020 | Lee ..................... | G01R 31/2642 |

FOREIGN PATENT DOCUMENTS

| | | | | |
|---|---|---|---|---|
| KR | 20130083149 A | * | 7/2013 | .......... H01L 23/576 |
| KR | 1020130123682 A | | 11/2013 | |
| KR | 1020140035804 A | | 3/2014 | |

* cited by examiner

*Primary Examiner* — Ajay Arora (74) *Attorney, Agent, or Firm* — William Park & Associates Ltd.

(57) ABSTRACT

A method of manufacturing a flip chip package includes forming a plurality of semiconductor chips and bonding the semiconductor chips to a package substrate. The method further includes electrically testing the plurality of semiconductor chips on the package substrate, molding the tested semiconductor chips, and singulating the molded chips. Electrically testing the semiconductor chips includes covering the semiconductor chips with a protection member.

12 Claims, 7 Drawing Sheets

METHOD OF MANUFACTURING A FLIP CHIP PACKAGE AND AN APPARATUS FOR TESTING FLIP CHIPS

CROSS-REFERENCES TO RELATED APPLICATION

The present application claims priority under 35 U.S.C. § 119(a) to Korean application number 10-2019-0054896, filed on May 10, 2019, in the Korean Intellectual Property Office, which is incorporated herein by reference in its entirety.

BACKGROUND

1. Technical Field

Various embodiments may generally relate to a method of manufacturing a semiconductor device, and more particularly, to a method of manufacturing a flip chip package and an apparatus for testing flip chips.

2. Related Art

In manufacturing semiconductor chips, various levels of testing may be performed on the semiconductor chips. A semiconductor chip failing such a test may be determined to be abnormal. For example, testing may be related to process variations, voltage, and temperature (PVT) of a semiconductor chip, an inter-symbol interference (ISI) of a semiconductor chip, etc. When an abnormal semiconductor chips are detected early, unnecessary costs are avoided so that the price of manufacturing semiconductor devices is reduced.

In order to provide semiconductor devices with a small size, a flip chip package structure using a bump as a conductive member has been proposed as a semiconductor package. The flip chip package may be manufactured by bonding the bump on the flip chip, molding an upper portion of the flip chip, marking a molded portion of the flip chip using a laser, attaching a solder ball on the flip chip to connect the solder ball with the bump, singulating a semiconductor substrate to form a plurality of the flip chip packages, and testing electrical characteristics of each of the flip chip packages.

In manufacturing the flip chip packages, errors may be frequently generated in bonding the semiconductor chip to a package substrate. However, because the electrical characteristics of the flip chip package may be tested after the molding process, it may be difficult to repair the errors of the flip chip package.

SUMMARY

In accordance with the present disclosure, a method of manufacturing a flip chip package includes forming a plurality of semiconductor chips and bonding the semiconductor chips to a package substrate. The method further includes electrically testing the plurality of semiconductor chips on the package substrate, molding the tested semiconductor chips, and singulating the molded chips. Electrically testing the semiconductor chips includes covering the semiconductor chips with a protection member.

Also in accordance with the present disclosure, an apparatus for testing flip chips includes a test wall configured to define a test space and a test board arranged in the test space to provide a package substrate to which a plurality of semiconductor chips is electrically connected during testing. The apparatus further includes a protecting member coupled to the test wall and configured to cover the semiconductor chips during testing.

Further in accordance with the present disclosure, an apparatus for testing non-molded bare semiconductor chips on a package substrate includes a protecting member configured to contact an edge portion of the package substrate during a test process, the protection member including a groove divided into a plurality of partitions configured to individually receive the semiconductor chips. Each of the plurality of partitions has a size for forming a gap between the partition and a corresponding semiconductor chip in the partition to provide clearance between the partition and each surface of the semiconductor chip.

BRIEF DESCRIPTION OF THE DRAWINGS

The above and other aspects, features, and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Figure 1:
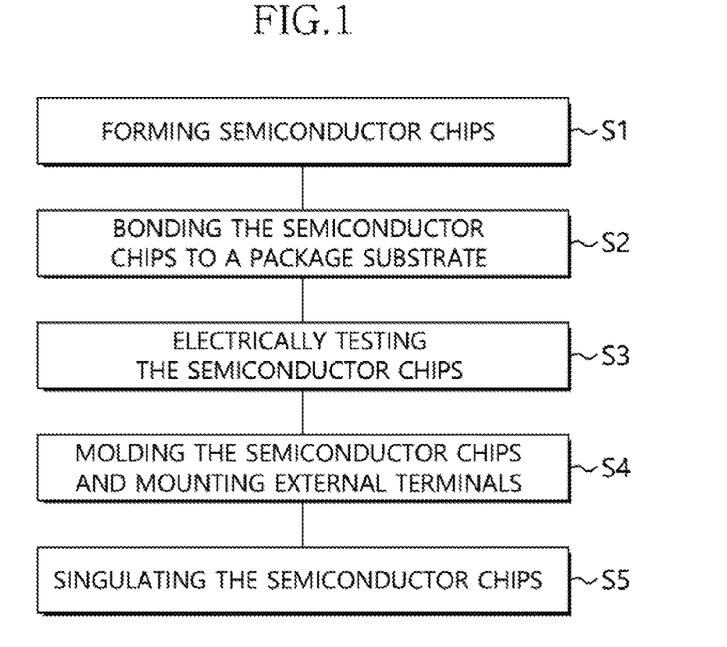
FIG. 1 is a flow chart illustrating a method of manufacturing a flip chip package in accordance with example embodiments.

FIG. 1 is a flow chart illustrating a method of manufacturing a flip chip package in accordance with example embodiments.

Referring to FIG. 1, a method of manufacturing a flip chip package in accordance with example embodiments may include forming a semiconductor chip (S1), bonding the semiconductor chip as a flip chip to a package substrate (S2), electrically testing the flip chip (S3), molding/soldering the flip chip, (S4) and singulating the flip chip (S5).

Forming the Semiconductor Chip (S1)

Figure 2:
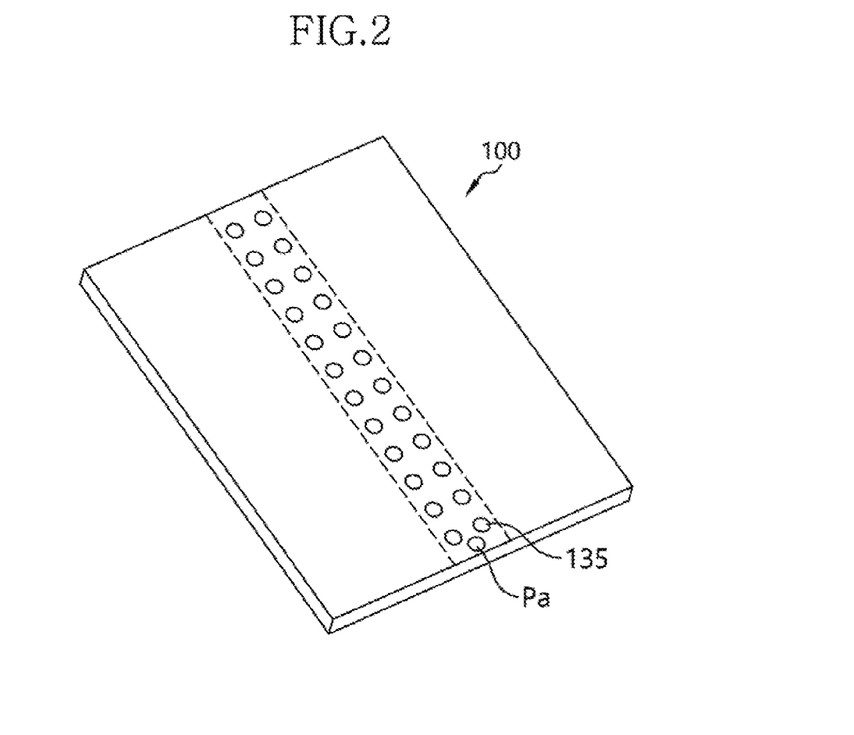
FIG. 2 is a perspective view illustrating a semiconductor chip in accordance with example embodiments.

FIG. 2 is a perspective view illustrating a semiconductor chip in accordance with example embodiments.

Referring to FIG. 2, the semiconductor chip 100 may include device layers such as semiconductor circuits (not shown), a plurality of conductive layers (not shown), and insulating layers (not shown).

The semiconductor chip 100 may have a pad region Pa. The pad region Pa may be positioned at a central portion of an upper surface of the semiconductor chip 100. Electrode pads (not shown) may be arranged in the pad region Pa. A plurality of bumps 135 may be arranged on the electrode pads in the pad region Pa. The bumps 135 may be directly/indirectly connected with the conductive layer electrically connected to the semiconductor circuit. The conductive layer may include a wiring line and a wiring contact connected between the device layers. Alternatively, the pad region Pa may be arranged at an edge portion of the upper surface of the semiconductor chip 100.

Figure 3:
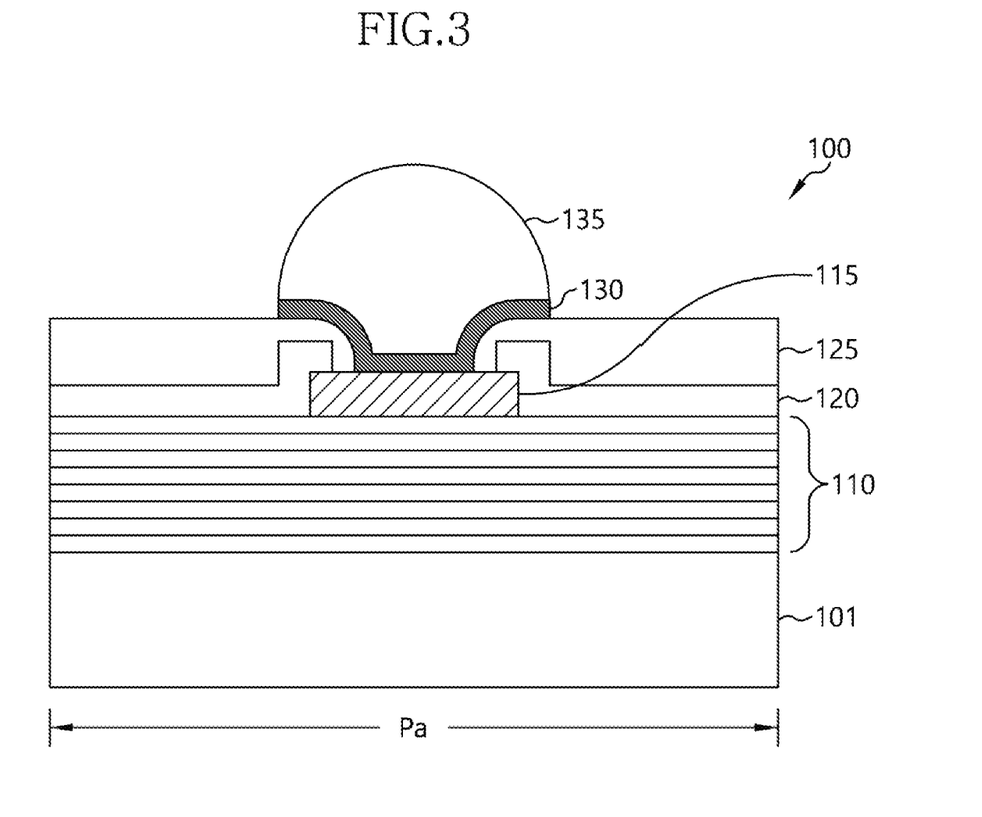
FIG. 3 is a cross-sectional view illustrating a pad region of the semiconductor chip in FIG. 2.

FIG. 3 is a cross-sectional view illustrating a pad region of the semiconductor chip in FIG. 2.

Referring to FIG. 3, a plurality of device layers 110 may be formed on an upper surface of a semiconductor substrate 101. The device layer 110 may include circuits, wirings (conductive layers) connected between the circuits, and insulating layers arranged between the circuits and the wirings. The electrode pad 115 may be arranged in the pad region Pa on an upper surface of the device layer 110. The electrode pad 115 may be electrically connected with at least one conductive layer of the device layer 110. A passivation layer 120 and a buffer layer 125 may be sequentially formed on the electrode pad 115. The passivation layer 120 and the buffer layer 125 may be partially etched to expose an upper surface of the electrode pad 115. Thus, openings configured to expose the electrode pad 115 may be formed through the passivation layer 120 and the buffer layer 125. The passivation layer 120 may include an oxide layer for protecting the device layer 110 from external environments. The buffer layer 125 may include an insulating material, polyimide, or an epoxy resin. The buffer layer 125 may absorb the weight of the bump to prevent the weight of the bump from being transferred to the device layer 110.

The bump 135 may be formed in the openings of the passivation layer 120 and the buffer layer 125. The bumps 135 may be electrically connected to the electrode pad 115 exposed through the openings. The bump 135 may include a spherical solder bump. An under bump metal (UBM) 130 may be interposed between the bump 135 and the electrode pad 115 to prevent diffusions of solders, thereby completing the semiconductor chip 100.

In example embodiments, a wafer level test such as a probe test may be performed through the electrode pad 115 between opening the electrode pad 115 and forming the bump 135.

In example embodiments, a substrate back grinding process and a dicing process may be additionally performed after forming the bump 135 to complete the semiconductor chip 100.

Bonding the Flip Chip (S2)

Figure 4:
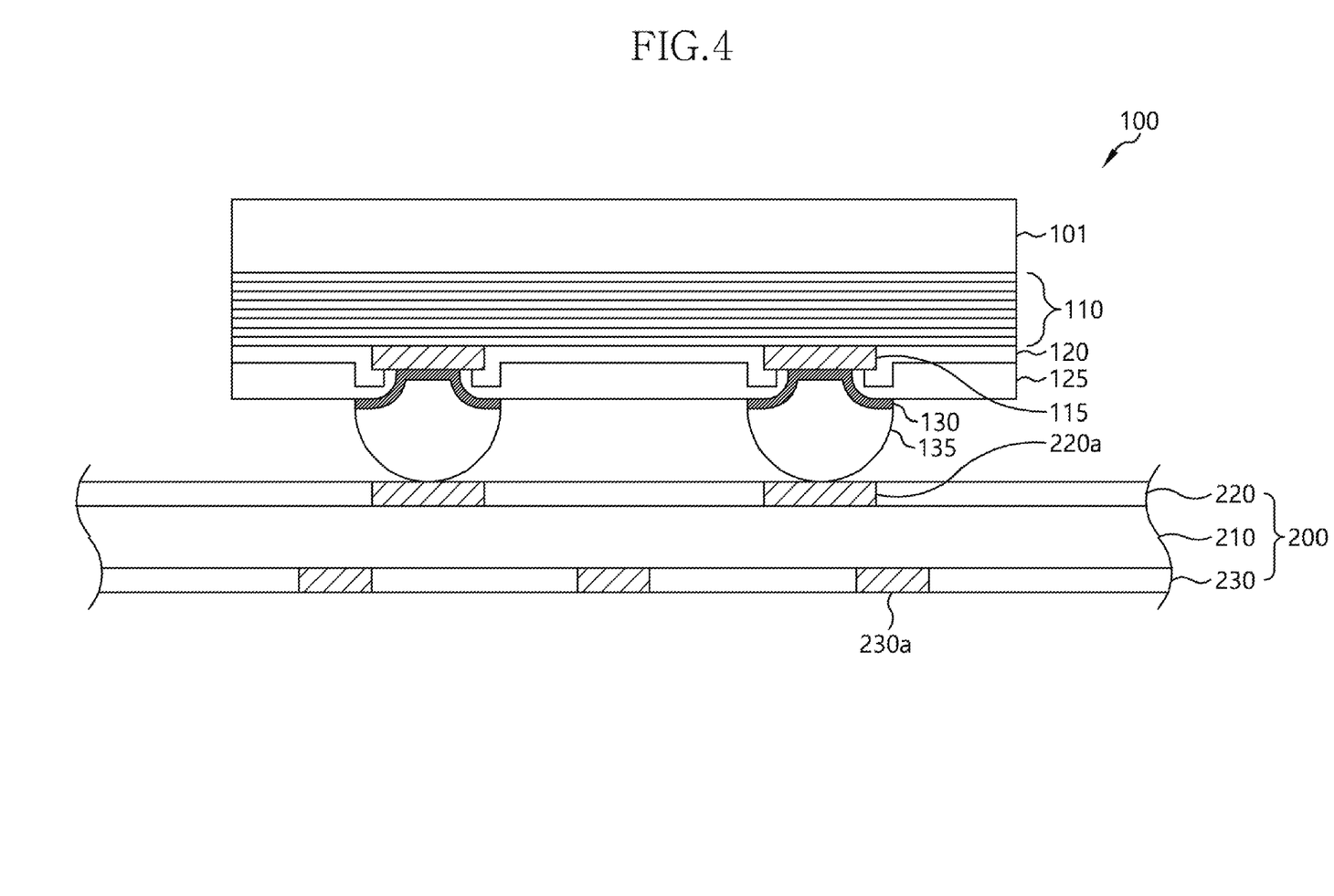
FIG. 4 is a cross-sectional view illustrating a bonding process of a flip chip in accordance with example embodiments.

FIG. 4 is a cross-sectional view illustrating a bonding process of a flip chip in accordance with example embodiments.

Referring to FIG. 4, bonding the flip chip (S2) may include flipping the semiconductor chip to orient the bump 135 toward a package substrate 200, and bonding the semiconductor chip 100 to the package substrate 200.

The package substrate 200 may include a body layer 210, an upper layer 220, and a lower layer 230. The upper layer 220 may include a first connection terminal 220a electrically connected to the bump 135. The lower layer 230 may include a second connection terminal 230a. An electrical signal may be communicated between the second connection terminal 230a and an external device.

The package substrate 200 may include a printed circuit board (PCB), a glass substrate, a flexible film, etc. The body layer 210 may include circuit patterns electrically connected between the first connection terminals 220a and the second connection terminals 220b. The first and second connection terminals 220a and 220b may include a photo solder resist.

When the bump 135 of the semiconductor chip 100 is connected to the first connection terminal 220a of the package substrate 200 by the flip chip bonding process, an internal signal of the semiconductor chip 100 may be transmitted to the external device through the first connection terminal 220a, the circuit pattern, and the second connection terminal 220b of the package substrate 200. Further, an external signal of the external device may be transmitted to the semiconductor device 100 through the first connection terminal 220a, the circuit pattern, and the second connection terminal 230a. The external device may include a system having a logic circuit, a memory module, a system including the logic circuit, and the memory module, etc.

Bonding the flip chip may be performed using a mechanical pressure of the die bonding apparatus.

Electrically Testing the Flip Chip (S3)

Figure 5:
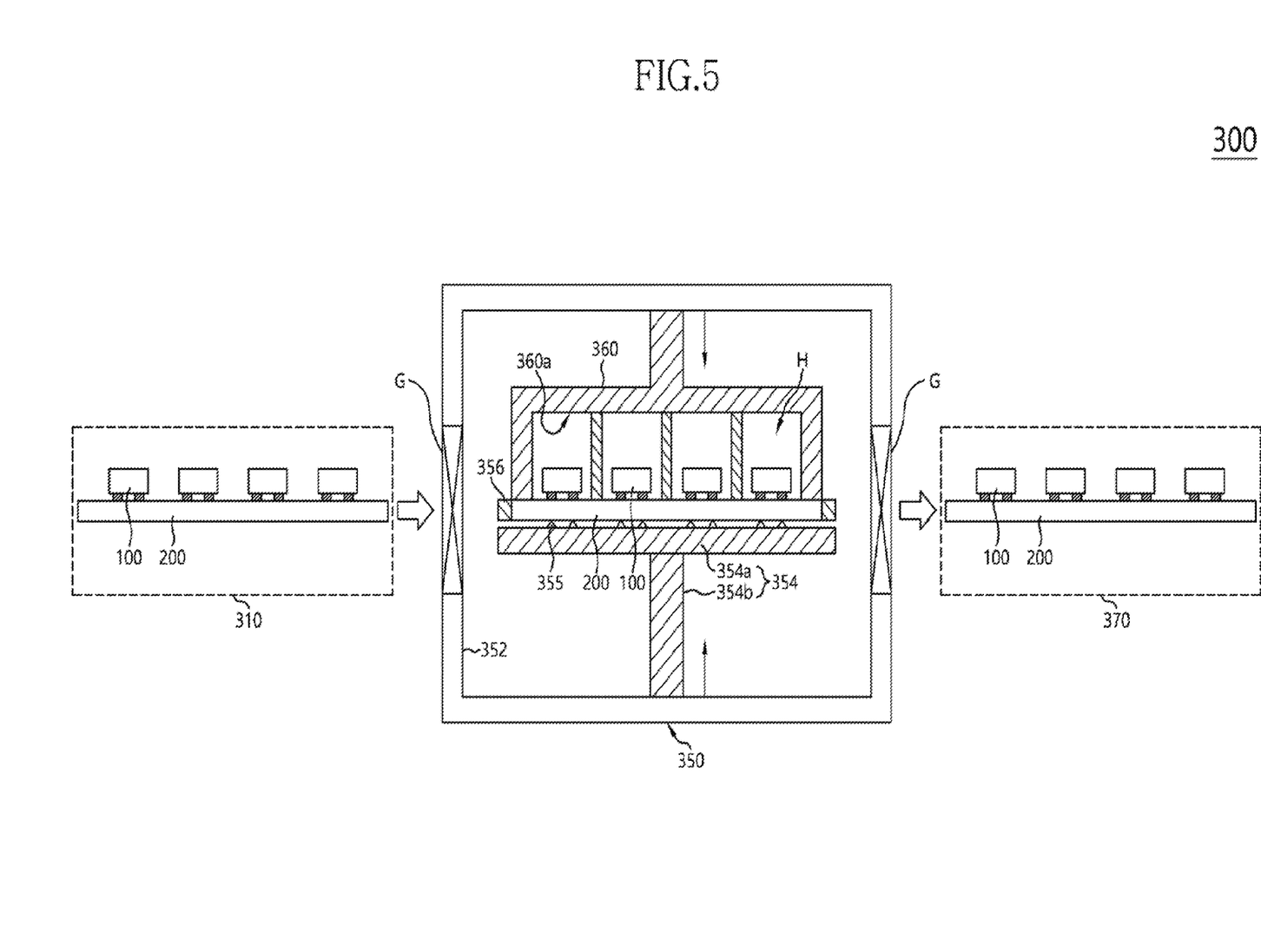
FIG. 5 is a cross-sectional view illustrating an apparatus for testing a flip chip in accordance with example embodiments.

FIG. 5 is a cross-sectional view illustrating an apparatus for testing a flip chip in accordance with example embodiments.

The bare semiconductor chips 100 bonded to the package substrate 200 may be electrically tested before the molding process.

In the electrical test, various voltages or various currents may be supplied to the second connection terminal 230a of the package substrate 200 to detect whether the bump 135 of the semiconductor chip 100 may be normally connected to the first connection terminal 220a of the package substrate 200 or not. The electrical test may further include a capacitance test, a resistance test, etc.

The electrical test may be performed using the apparatus illustrated in FIG. 5.

Referring to FIG. 5, the electrical test apparatus 300 may include a loader 310, a tester 350, and an unloader 370.

The package substrate 200 with the semiconductor chips 100 may be on standby in the loader 310.

The tester 350 may include a test wall 352, a test board 354, a substrate-fixing member 356, and a protection member 360.

The test wall 352 may define a test space where the test process may be performed. The test wall 352 may include gates G connected to the loader 310 and the unloader 370. The package substrate 200 may be transferred through the gates G.

The test board 354 may be arranged in the test space defined by the test wall 352.

The test board 354 may include a substrate stage 354*a* and a support 354*b*. The substrate stage 354*a* may have a size for receiving the package substrate 200. The substrate stage 354*a* may be configured to make contact with the lower surface 230 of the package substrate 200. The substrate stage 354*a* may include a plurality of test pins 355. The test pins 355 may be arranged on a surface of the substrate stage 354*a* fronting the package substrate 200. The test pins 355 may make contact with the second connection terminal 230*a* of the package substrate 200.

The support 354*b* may be configured to support a central portion of a lower surface of the substrate stage 354*a*. The support 354*b* may be vertically moved. Thus, when the package substrate 200 with the semiconductor chips 100 may be loaded into the test space, the support 354*b* may be upwardly moved to contact the test pins 355 with the second connection terminal 230*a* of the package substrate 200.

Figure 6:
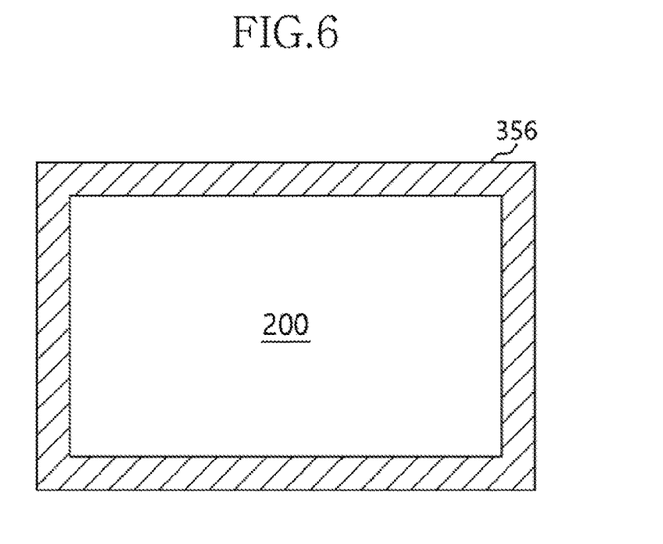
FIG. 6 is a plan view illustrating a substrate-fixing member in accordance with example embodiments.

FIG. 6 is a plan view illustrating a substrate-fixing member in accordance with example embodiments.

Referring to FIG. 6, the substrate-fixing member 356 may have a frame shape. The substrate-fixing member 356 may primarily fix the package substrate 200 in the test space. Although not depicted in drawings, the substrate-fixing member 356 may be mechanically connected to at least one portion of the test wall 352 or the test board 354 to fix the package substrate 200 with the semiconductor chips 100.

Figure 7:
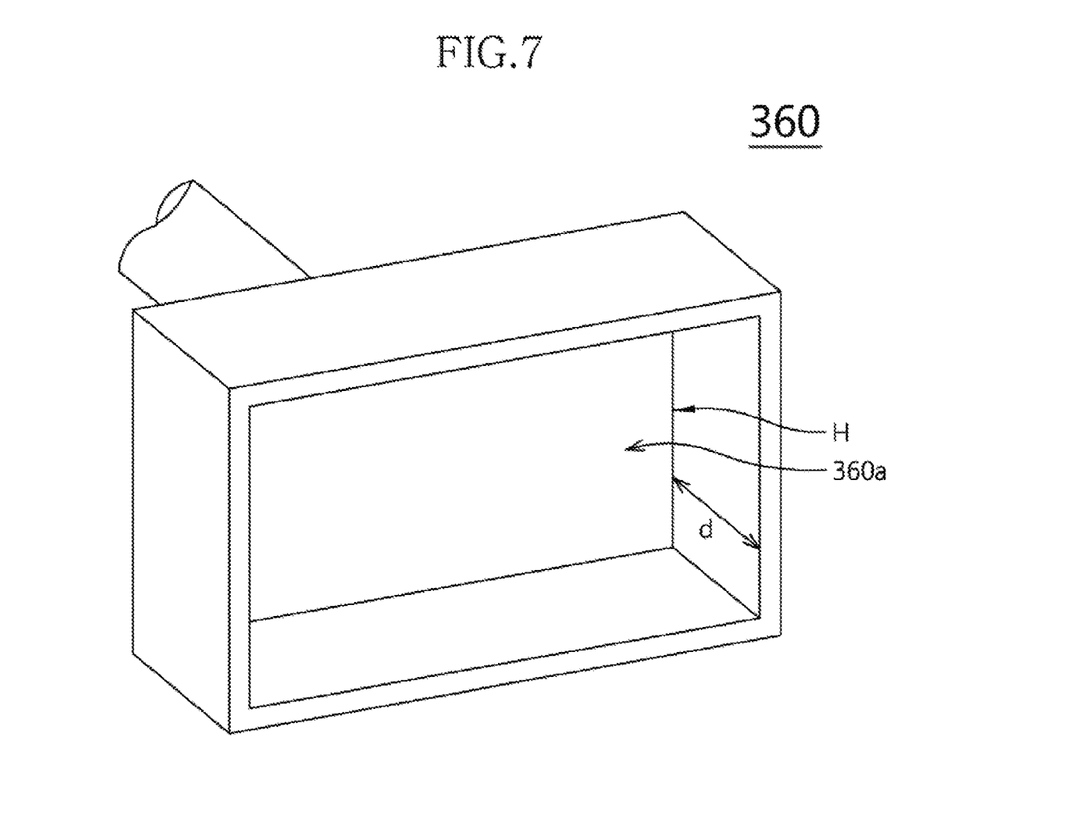
FIG. 7 is a perspective view illustrating a protection member in accordance with example embodiments.

FIG. 7 is a perspective view illustrating a protection member in accordance with example embodiments.

Referring to FIG. 7, the protection member 360 may protect the bare semiconductor chips 100 loaded into the test apparatus 300 during the electrical test. The protection member 360 may be movably connected to an upper surface, also referred to as a portion of the test wall 352, of the test space so that the protection member 360 is able to move up and down in the vertical direction. The protection member 360 may have a groove H configured to receive the semiconductor chips 100 bonded to the package substrate 200. The groove H of the protection member 360 may have a size to form a gap between an inner surface 360*a* of the groove H and any outer surface of the semiconductor chips 100 bonded to the package substrate 200. Thus, the inner surface 360*a* of the groove H might not make contact with any outer surface of the semiconductor chips 100 bonded to the package substrate 200. For example, in order to prevent a contact between the inner surface 360*a* of the groove H and the outer surface of the semiconductor chip 100, the groove H may have a depth d greater than a sum of a thickness of the semiconductor chip 100 and a thickness of the bump 135 by about 1 mm to about 10 mm. Further, the protection member 360 may include a conductive material or a dissipative material having a heat dissipative property, easy workability and good durability.

Figure 8:
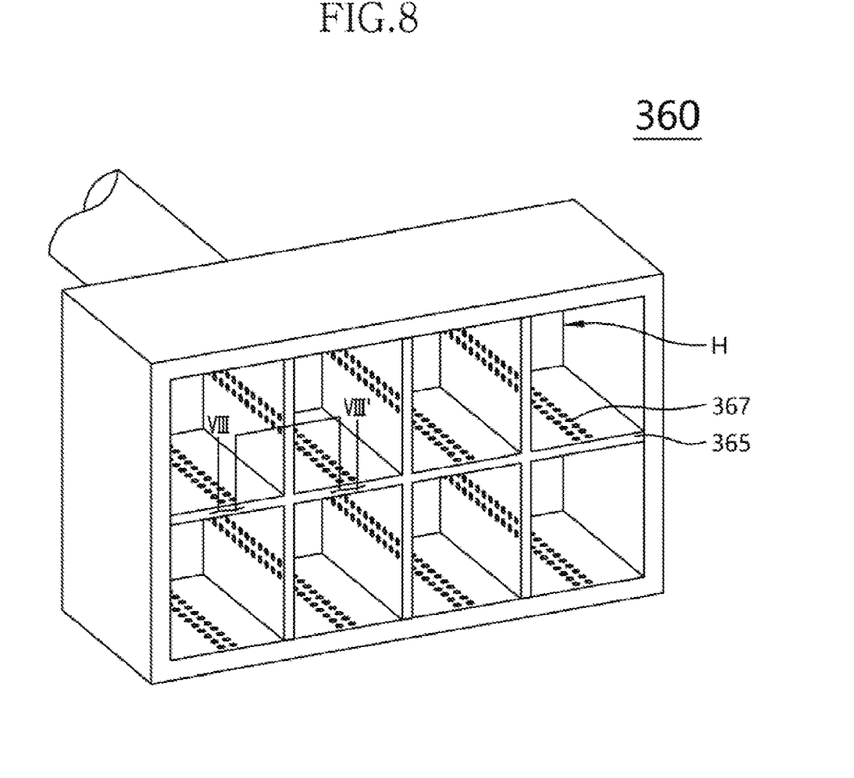
FIG. 8 is a perspective view illustrating a protection member in accordance with example embodiments.
Figure 9:
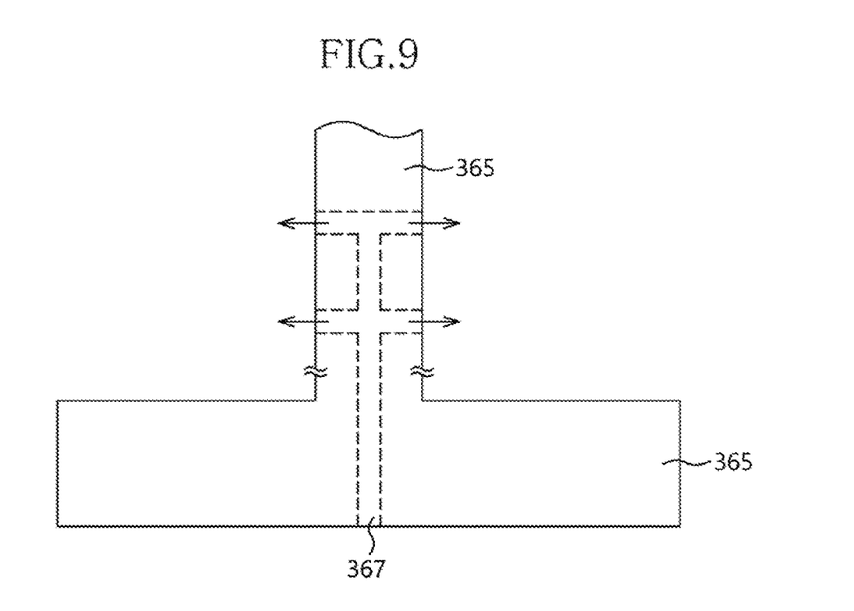
FIG. 9 is a cross-sectional view taken along a line VIII-VIII' in FIG. 8.

FIG. 8 is a perspective view illustrating a protection member in accordance with example embodiments, and FIG. 9 is a cross-sectional view taken along a line VIII-VIII' in FIG. 8.

Referring to FIGS. 8 and 9, a protection member 360 may further include partitions 365 arranged in the groove H to individually receive each of the semiconductor chips 100. For example, when eight semiconductor chips 100 are bonded to the package substrate 200, the partitions 365 may define eight spaces in the groove H. Further, vacuum holes 367 may be formed through the protection member 360 and the partitions 365 to provide the semiconductor chips 100 in the spaces defined by the partitions 365. Thus, vacuum may be supplied to each of the semiconductor chips 100 through the vacuum holes 367 to firmly fix the semiconductor chips 100, thereby reducing damages to the semiconductor chips 100. The vacuum holes 367 may be connected to a vacuum pump in the test apparatus.

Hereinafter, operations of the test apparatus in accordance with this example embodiment are described in detail.

The package substrates 200 on which the flip chip bonding process (S2) is performed may be received in a magazine before the molding process. The package substrates 200 may be sequentially loaded into the loader 310. The package substrate 200 in the magazine may be sequentially loaded into the loader 310 by a pusher.

The package substrate 200 in the loader 310 may be on standby until a previous test process in the tester 350 is finished. After the previous test process is finished, the package substrate 200 in the loader 310 may be transferred to the tester 350. The package substrate 200 may be transferred to the tester 350 by a conveyor belt.

The substrate-fixing member 356 may primarily fix the package substrate 200 in the tester 350. The protection member 360 or 360 may be moved downward to contact the edge portion of the package substrate 200 fixed by the substrate-fixing member 356 with the edge portion of the protection member 360. Thus, the package substrate 200 and the protection member 360 may fully enclose the semiconductor chip 100.

The support 354*b* of the test board 354 may be moved upward so the test pins 355 of the substrate stage 354*a* contact the second connection terminals 230*a* of the package substrate 200. The test board 354 may provide the second connection terminals 230*a* of the package substrate 200 with a current or a voltage through the test pins 355. Therefore, a bonding failure between the semiconductor chip 100 and the package substrate 200, i.e., between the bump 135 and the first connection terminal 220*a*, a contact failure between the semiconductor chip 100 and the bump 135, etc., may be detected based on electrical characteristics of current/voltage/resistance transmitted from the package substrate 200 to the semiconductor chip 100. Alternatively, the test process may use other test techniques as well as the current/voltage test.

According to example embodiments, although the electrical test may be performed on the semiconductor chips to which the molding process has not yet been performed, the semiconductor chips 100 are not be damaged because the protection member 360 may fully cover the semiconductor chips 100.

After the test process, the package substrate 200 may be unloaded to the unloader 370 through a gate. Because the semiconductor chips 100 is not yet molded, a semiconductor chip 100 determined to be abnormal in the electrical test (S3) may be repaired.

Molding/Mounting and Singulating the Semiconductor Chips

Figure 10:
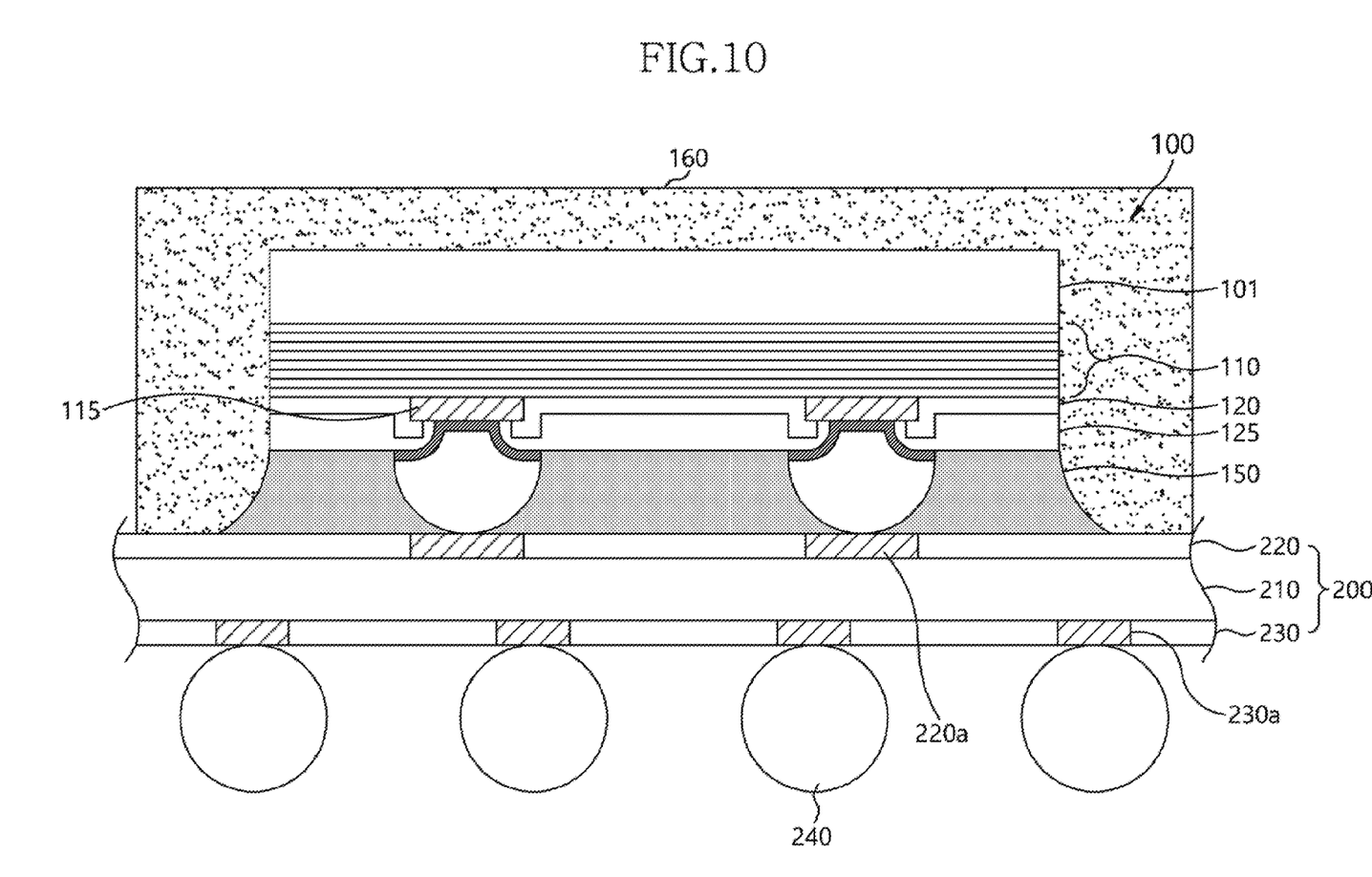
FIG. 10 is a cross-sectional view illustrating a molding process and a mounting process of a semiconductor chip in accordance with example embodiments.

FIG. 10 is a cross-sectional view illustrating a molding process and a mounting process of a semiconductor chip in accordance with example embodiments.

Referring to FIG. 10, an underfilling layer 150 may be formed between the bump 135 of the semiconductor chip 100 to which the electrical test (S3) and/or the repair process (S4) may be performed and the package substrate 200. The underfilling layer 150 may protect the bump 135 from the external environments. The underfilling layer 150 may be annealed to reinforce an adhesion force between the bump 135 and the first connection terminal 220a of the package substrate 200.

A molding member 160 may be formed on the package substrate 200 to cover the semiconductor chips 100. The molding member 160 may include an epoxy resin. After annealing the molding member 160, a laser-marking process may be performed on the molding member 160.

An external terminal 240, such as a solder ball, may be mounted on the second connection terminal 230 of the package substrate 200. Here, the sequence of the molding process, the laser-marking process, and the mounting process may be changed.

The semiconductor chips 100 may be singulated to complete the flip chip package.

According to example embodiments, after bonding a semiconductor chip to a package substrate, an electrical test may be performed before a molding process. Thus, because the electrical test is performed before the molding process is performed, any contact failure between the semiconductor chip and the package substrate may be repaired. The packaging process may then be performed on the semiconductor chip and the package substrate having the repaired contact.

Further, the protection member configured to cover the semiconductor chip in the test process may be installed at the tester to reduce the damage to the bare semiconductor chip. The protection member may cover the semiconductor chips to prevent influences of the semiconductor chips in the test process, thereby reducing possible damage to the semiconductor chip.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. An apparatus for testing flip chips, the apparatus comprising:
   a test wall configured to define a test space;
   a test board arranged in the test space, wherein a package substrate on which a plurality of semiconductor chips to be tested are electrically connected is loaded on the test board; and
   a protection member coupled to the test wall and configured to individually cover each semiconductor chip during testing,
   wherein the protection member includes a plurality of bottom portions, and the plurality of bottom portions is contacted to the package substrate for individually covering each semiconductor chip.

2. The apparatus of claim 1, wherein the test board comprises:
   a substrate stage including an upper surface and a bottom surface;
   a support configured to support the bottom surface of the substrate stage and vertically move the substrate stage to contact the upper surface of with the package substrate; and
   a plurality of test pins arranged on the upper surface of the substrate stage to electrically connect terminals of the package substrate with the substrate stage to receive an electrical signal.

3. The apparatus of claim 2, further comprising a substrate-fixing member configured to fix the package substrate when the package substrate is loaded into the test space, wherein the substrate-fixing member is formed to a frame shape on the edge of the package substrate.

4. The apparatus of claim 1, wherein the protection member further comprises a plurality of partitions arranged in the groove to form spaces for individually receiving semiconductor chips of the plurality of semiconductor chips.

5. The apparatus of claim 4, wherein the protection member further comprises at least one vacuum hole formed in the partitions to provide a vacuum to the test spaces.

6. The apparatus of claim 1, wherein:
   the protection member is installed at an upper portion of the test wall; and
   the protection member is moved downward, when the package substrate on which the plurality of semiconductor chips to be tested are mounted is loaded into the test space, to contact a plurality of portions of the package substrate.

7. The apparatus of claim 1, wherein the protection member comprises at least one of a conductive material and a dissipative material.

8. The apparatus of claim 4, wherein upper portion of each partition is contacted to a ceiling portion of the protection member to completely separate the plurality of test grooves receiving each semiconductor chips.

9. An apparatus for testing non-molded bare semiconductor chips on a package substrate, the apparatus comprising:
   a protection member configured to contact an edge portions of the package substrate during a test process, the protection member including a plurality of partitions for defining a plurality of grooves to individually receiving each of the semiconductor chips,
   wherein each of the plurality of partitions has a size for forming a gap between the partition and a corresponding semiconductor chip in the partition to provide clearance between the partition and each surface of the semiconductor chip.

10. The apparatus of claim 9, wherein each partition of the protection member comprises vacuum holes for providing a vacuum to the partitions during the testing process.

11. The apparatus of claim 9, wherein each groove has a depth greater than a sum of a thickness of a semiconductor chip of the plurality of semiconductor chips and a thickness of a conductive bump electrically connecting the semiconductor chip with the package substrate.

12. The apparatus of claim 9, wherein upper portion of each partition is contacted to a ceiling portion of the protection member to completely separate the plurality of grooves receiving each semiconductor chips.

* * * * *